United States Patent
Lius et al.

(10) Patent No.: US 10,304,909 B2
(45) Date of Patent: May 28, 2019

(54) DISPLAY DEVICE

(71) Applicants: Chandra Lius, Miao-Li County (TW); Kuan-Feng Lee, Miao-Li County (TW); Chung-Wen Yen, Miao-Li County (TW); Chao-Hsiang Wang, Miao-Li County (TW)

(72) Inventors: Chandra Lius, Miao-Li County (TW); Kuan-Feng Lee, Miao-Li County (TW); Chung-Wen Yen, Miao-Li County (TW); Chao-Hsiang Wang, Miao-Li County (TW)

( * ) Notice: Subject to any disclaimer, the term of this patent is extended or adjusted under 35 U.S.C. 154(b) by 3 days.

(21) Appl. No.: 15/836,927

(22) Filed: Dec. 11, 2017

(65) Prior Publication Data

US 2018/0197925 A1    Jul. 12, 2018

(30) Foreign Application Priority Data

Jan. 11, 2017  (CN) .......................... 2017 1 0019795

(51) Int. Cl.
  *H01L 33/00*  (2010.01)
  *H01L 27/32*  (2006.01)

(52) U.S. Cl.
  CPC ...... *H01L 27/3216* (2013.01); *H01L 27/3276* (2013.01)

(58) Field of Classification Search
  None
  See application file for complete search history.

(56) References Cited

U.S. PATENT DOCUMENTS

| | | | | |
|---|---|---|---|---|
| 2015/0364712 A1* | 12/2015 | Lee | ...................... | H01L 51/5209 257/40 |
| 2016/0125789 A1* | 5/2016 | Choi | .................... | G09G 3/2003 345/694 |
| 2016/0329384 A1* | 11/2016 | Hou | ...................... | H01L 27/3213 |
| 2017/0011685 A1* | 1/2017 | Jeon | ...................... | G09G 3/3233 |
| 2018/0076270 A1* | 3/2018 | Kwon | ................. | H01L 27/3258 |

\* cited by examiner

*Primary Examiner* — Kevin M Picardat
(74) *Attorney, Agent, or Firm* — JCIPRNET

(57) ABSTRACT

A display device includes a substrate, first and second data lines, and first and second sub-pixel units. The first sub-pixel unit includes a first electrode and a first light emitting layer disposed on the first electrode. The first electrode has a first region with a first area overlapping the first data line. The second sub-pixel unit includes a second electrode and a second light emitting layer disposed on the second electrode. The second electrode has a second region with a second area overlapping the second data line, wherein the first area is greater than the second area. The luminescence color of the first light emitting layer and the luminescence color of are different, and the luminescence color of the first light emitting layer is blue.

14 Claims, 5 Drawing Sheets

DISPLAY DEVICE

CROSS-REFERENCE TO RELATED APPLICATION

This application claims the priority benefit of China application serial no. 201710019795.4, filed on Jan. 11, 2017. The entirety of the above-mentioned patent application is hereby incorporated by reference herein and made a part of this specification.

BACKGROUND

Field of the Disclosure

The disclosure relates to a device, particularly to a display device.

Description of Related Art

Recently, with the development of electronic products, advancements in techniques and increasingly wider application thereof, there has been a rapidly growing demand for displays having small volume and low power consumption characteristics. Among the displays, light emitting diode (LED) displays have become one of the candidates for next generation displays because of their characteristics such as self-luminescence, high brightness, wide viewing angle, high response speed and so on. To develop LED displays having high light emitting efficiency is one of the primary trends in current display techniques.

SUMMARY

A display device of the disclosure includes a substrate, a first data line, a second data line, a first sub-pixel unit and a second sub-pixel unit. An upper surface of the substrate has a normal direction. The first data line and the second data line are disposed on the substrate. The first sub-pixel unit is disposed on the substrate, wherein the first sub-pixel unit includes a first electrode and a first light emitting layer. The first electrode is electrically coupled to the first data line. The first electrode has a first region overlapping the first data line in the normal direction. The first region has a first area. The first light emitting layer is disposed on the first electrode. The second sub-pixel unit is disposed on the substrate, wherein the second sub-pixel unit includes a second electrode and a second light emitting layer. The second electrode is electrically coupled to the second data line. The second electrode has a second region overlapping the second data line in the normal direction. The second region has a second area, wherein the first area is greater than the second area. The second light emitting layer is disposed on the second electrode, wherein a luminescence color of the first light emitting layer is different from a luminescence color of the second light emitting layer, and the luminescence color of the first light emitting layer is blue.

To make the aforementioned features and advantages of the disclosure more clear and comprehensible, embodiments accompanied with drawings are described in detail as follows.

DESCRIPTION OF THE EMBODIMENTS

Figure 1:
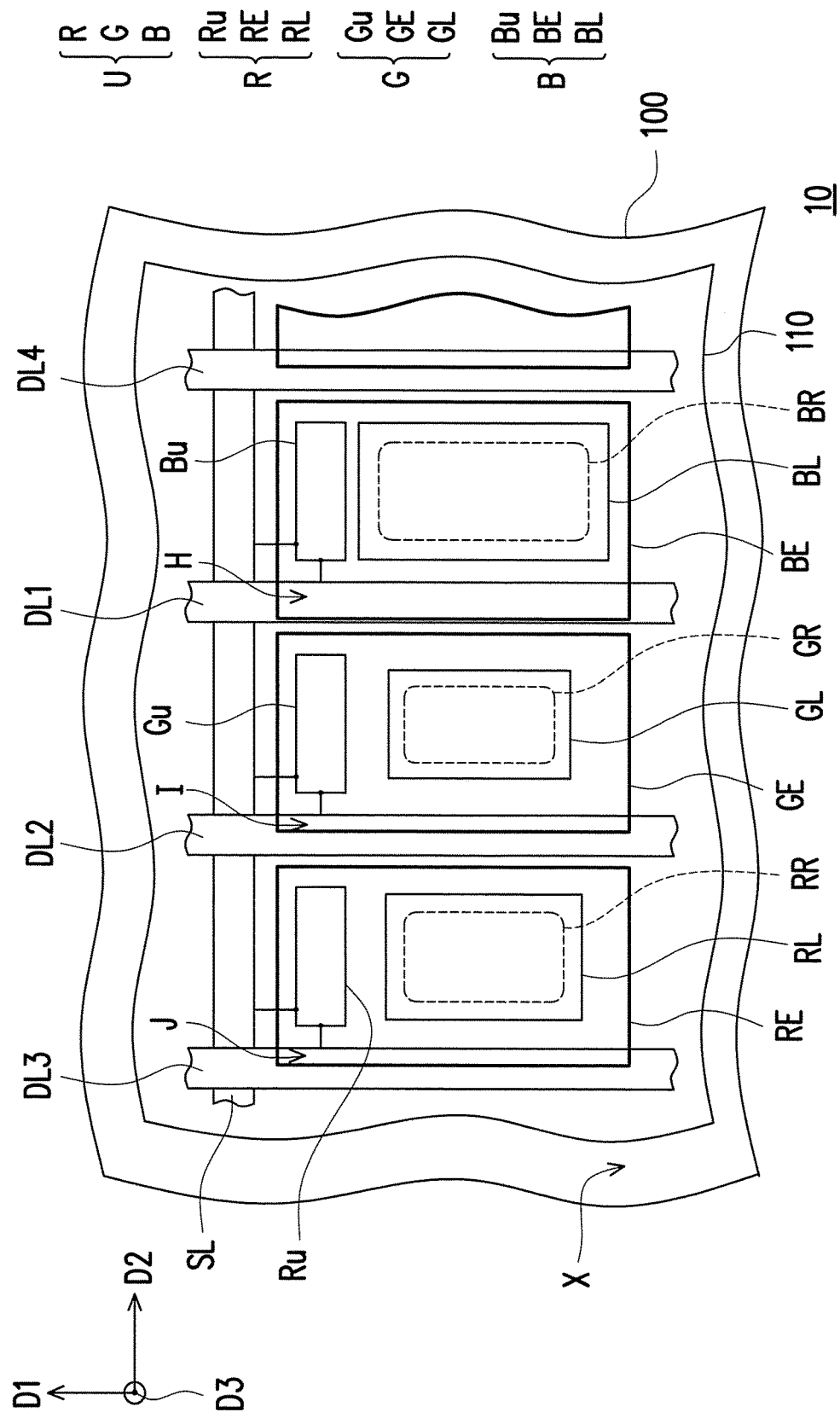
FIG. 1 is a partial schematic top view of a display device according to a first embodiment of the disclosure.

Herein, wherever possible, the same reference numerals are used in the drawings and the description to refer to the same or similar parts.

In the disclosure, when it is said that a certain layer is disposed "on" another layer, it may mean that the certain layer is "directly" on another layer, or is "indirectly" on another layer (i.e., at least one layer may be interposed between the certain layer and the another layer).

In the disclosure, a certain deviation may exist between any two numerical values or directions for comparison. If a first value is equal to a second value, it implies that a deviation of about 10% may exist between the first value and the second value; if a first direction is perpendicular to a second direction, an angle between the first direction and the second direction may be in the range of 80 degrees to 100 degrees; and if a first direction is parallel to a second direction, an angle between the first direction and the second direction may be in the range of 0 degree to 10 degrees.

In the disclosure, when it is said that a first component is "electrically coupled to" a second component, it may mean that a current flows between the first component and the second component, or that, while no current flows between the first component and the second component, the first component and the second component are indirectly connected via at least one passive component or active component, wherein the passive component may be a resistor, a capacitor, or an inductor or the like, and the active component may be a transistor, a rectifier, or a vacuum tube or the like.

In the disclosure, a "luminescence color" of a light emitting layer refers to, in the case where the light emitting layer is located between two electrodes and when a current flows through the light emitting layer, a color of electromagnetic radiation generated from the light emitting layer, which is sensed by an observer after the observer's eye receives the electromagnetic radiation. At this moment, different luminescence colors correspond to different colors. Alternatively, the electromagnetic radiation may not be visible light. At this moment, a corresponding spectrum is obtained by measurement using an instrument, and different luminescence colors correspond to different spectra.

Hereinafter, various embodiments are used to describe the display device of the disclosure in detail. These embodiments merely serve as examples of implementing the disclosure and are not intended to limit the disclosure.

Figure 2:
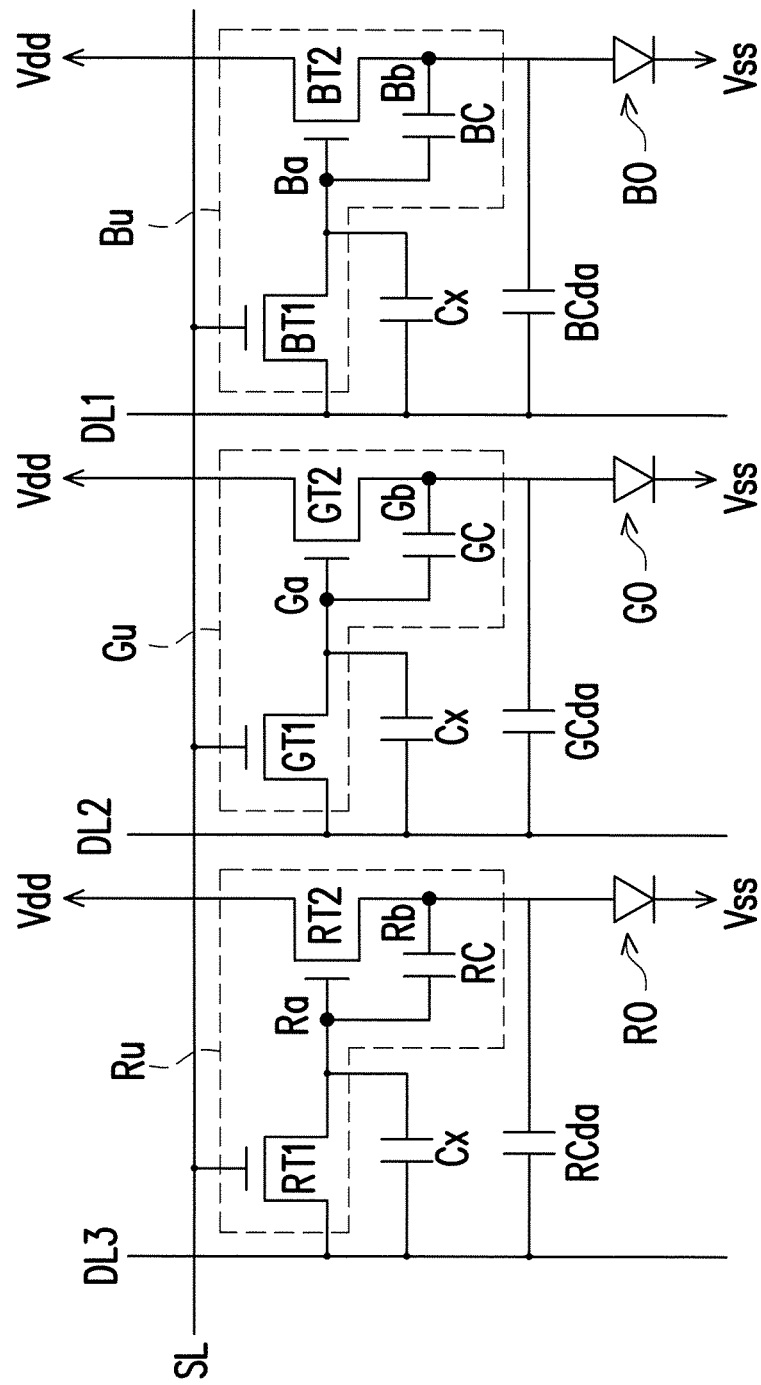
FIG. 2 is a partial equivalent circuit diagram of the display device according to the first embodiment of the disclosure.

FIG. 1 is a partial schematic top view of a display device according to a first embodiment of the disclosure. FIG. 2 is a partial equivalent circuit diagram of the display device according to the first embodiment of the disclosure. Referring to FIG. 1 and FIG. 2 together, in the present embodiment, a display device 10 includes a substrate 100 and a plurality of pixel units U disposed on the substrate 100, wherein each of the pixel units U includes a sub-pixel unit B, a sub-pixel unit G and a sub-pixel unit R. In addition, in the present embodiment, the display device 10 further includes data lines DL1 to DL4, a scan line SL and an electrode layer 110. For the ease of description, FIG. 1 illustrates one pixel unit U. However, any person skilled in the art should understand that a plurality of pixel units U are generally arranged in an array on the substrate 100. On the other hand, in the present embodiment, although each of the pixel units U includes the sub-pixel units B, G and R, the disclosure is not limited thereto. In other embodiments, each of the pixel units U may further include other sub-pixel units such as a white sub-pixel unit.

In the present embodiment, an upper surface X of the substrate 100 has a normal direction D3. In addition, the material of the substrate 100 may be glass, quartz, an organic polymer, or metal or the like. If the material of the substrate 100 is an organic polymer, in terms of specific examples, the organic polymer is, for example (but not limited to): polyimide (PI), polyethylene terephthalate (PET), polycarbonate (PC) or the like.

The data lines DL1 to DL4 and the scan line SL are disposed on the substrate 100 and extend in different directions from each other. Specifically, in the present embodiment, the data lines DL1 to DL4 extend along a direction D1, and the scan line SL extends along a direction D2, wherein the directions D1 and D2 are perpendicular to each other. In addition, the data lines DL1 to DL4 and the scan line SL belong to different layers. Considering conductivity, the data lines DL1 to DL4 and the scan line SL are generally made of a metal material. However, the disclosure is not limited thereto. In other embodiments, the data lines DL1 to DL4 and the scan line SL may be made of, for example (but not limited to): other conductive materials such as alloy, nitride of a metal material, oxide of a metal material, oxynitride of a metal material or the like, or a stacked layer of a metal material and the aforementioned other conductive materials.

The sub-pixel units B, G and R are disposed on the substrate 100. Specifically, in the present embodiment, the sub-pixel unit B includes an electrode BE and a light emitting layer BL disposed on the electrode BE; the sub-pixel unit G includes an electrode GE and a light emitting layer GL disposed on the electrode GE; and the sub-pixel unit R includes an electrode RE and a light emitting layer RL disposed on the electrode RE. In addition, the electrode layer 110 is located above the light emitting layers BL, GL and RL. The electrode BE and a portion of the electrode layer 110 respectively serve as anode and cathode or respectively serve as cathode and anode, and the electrode BE and a portion of the electrode layer 110 respectively contact the light emitting layer BL. The same rule applies to the rest. It is worth mentioning that, generally, in order to drive the sub-pixel units B, G and R, the sub-pixel unit B further includes a sub-pixel driving unit Bu, the sub-pixel unit G further includes a sub-pixel driving unit Gu, and the sub-pixel unit R further includes a sub-pixel driving unit Ru.

Specifically, in the present embodiment, the sub-pixel driving unit Bu may include a switch transistor BT1, a driver transistor BT2 and a capacitor BC; the sub-pixel driving unit Gu may include a switch transistor GT1, a driver transistor GT2 and a capacitor GC; and the sub-pixel driving unit Ru may include a switch transistor RT1, a driver transistor RT2 and a capacitor RC. That is, in the present embodiment, explanation is given of an example where the sub-pixel driving units Bu, Gu and Ru all have a two-transistor-one-capacitor (2T1C) structure. However, the disclosure is not limited thereto. In other embodiments, the sub-pixel driving units Bu, Gu and Ru may also have a three-transistor-one-capacitor (3T1C) structure, a four-transistor-two-capacitor (4T2C) structure, a six-transistor-one-capacitor (6T1C) structure, a seven-transistor-two-capacitor (7T2C) structure, or any other structure that can be used as a pixel driving unit. The sub-pixel driving units of the embodiments of the disclosure may include N-type metal oxide semiconductor (NMOS) transistors, P-type metal oxide semiconductor (PMOS) transistors or complementary metal oxide semiconductor (CMOS) transistors. Alternatively, the sub-pixel driving units of the embodiments of the disclosure may include NMOS transistors in combination with PMOS transistors. In other words, a part of the sub-pixel driving units may include NMOS transistors and the other part of the sub-pixel driving units may include PMOS transistors. Alternatively, an active layer material used in the transistors of the embodiments of the disclosure may include (but is not limited to): amorphous silicon, low-temperature polycrystalline silicon (LTPS) and indium gallium zinc oxide (IGZO). Alternatively, the active layer material used in the transistors of the embodiments of the disclosure may be a combination of the aforementioned examples. For example, the active layer material of a part of the transistors is LTPS, and the active layer material of the other part of the transistors is IGZO.

Specifically, as shown in FIG. 2, NMOS transistors are used as an example in the embodiments of the disclosure, and a source and a drain of the transistors are defined according to a flowing direction of current, wherein the current flows from the drain to the source in the NMOS transistors. Nonetheless, the above definitions are for facilitating understanding, and the disclosure is not limited thereto. A gate of the switch transistor RT1 is electrically connected to the scan line SL; a drain of the switch transistor RT1 is electrically connected to the data line DL3; a source of the switch transistor RT1 is electrically connected to the driver transistor RT2; a gate of the driver transistor RT2 is electrically connected to the source of the switch transistor RT1; a drain of the driver transistor RT2 is electrically connected to a power supply voltage Vdd; one electrode terminal of the capacitor RC is electrically connected to the gate of the driver transistor RT2; and the other electrode terminal of the capacitor RC is electrically connected to a source of the driver transistor RT2. Similarly, as shown in FIG. 2, a gate of the switch transistor GT1 is electrically connected to the scan line SL; a drain of the switch transistor GT1 is electrically connected to the data line DL2; a source of the switch transistor GT1 is electrically connected to the driver transistor GT2; a gate of the driver transistor GT2 is electrically connected to the source of the switch transistor GT1; a drain of the driver transistor GT2 is electrically connected to the power supply voltage Vdd; one electrode terminal of the capacitor GC is electrically connected to the gate of the driver transistor GT2; and the other electrode terminal of the capacitor GC is electrically connected to a source of the driver transistor GT2. Similarly, as shown in FIG. 2, a gate of the switch transistor BT1 is electrically connected to the scan line SL; a drain of the switch transistor BT1 is electrically connected to the data line DL1; a source of the switch transistor BT1 is electrically connected to the driver transistor BT2; a gate of the driver transistor BT2 is electrically connected to the source of the switch transistor BT1; a drain of the driver transistor BT2 is electrically connected to the power supply voltage Vdd; one electrode terminal of the capacitor BC is electrically connected to the gate of the driver transistor BT2; and the other electrode terminal of the capacitor BC is electrically connected to a source of the driver transistor BT2.

In the present embodiment, the capacitor RC may control a voltage difference $V_{GS}$ between a node Ra and a node Rb, the capacitor GC may control the voltage difference $V_{GS}$ between a node Ga and a node Gb, and the capacitor BC may control the voltage difference $V_{GS}$ between a node Ba and a node Bb.

In addition, in the present embodiment, parasitic capacitance Cxs are generated respectively between the data line DL3 and the node Ra of the sub-pixel driving unit Ru, between the data line DL2 and the node Ga of the sub-pixel driving unit Gu, and between the data line DL1 and the node Ba of the sub-pixel driving unit Bu. In this way, when the data line DL3 provides a signal and a voltage variation is continuously present, due to a coupling effect caused by the parasitic capacitance Cx, a voltage difference variation amount $\Delta V_{GSR}$ occurs in the voltage difference $V_{GS}$ between the nodes Ra and Rb. Similarly, when the data line DL2 provides a signal and a voltage variation is continuously present, due to the coupling effect caused by the parasitic capacitance Cx, a voltage difference variation amount $\Delta V_{GSG}$ occurs in the voltage difference $V_{GS}$ between the nodes Ga and Gb; and when the data line DL1 provides a signal and a voltage variation is continuously present, due to the coupling effect caused by the parasitic capacitance Cx, a voltage difference variation amount $\Delta V_{GSB}$ occurs in the voltage difference $V_{GS}$ between the nodes Ba and Bb.

In addition, as shown in FIG. 2, the source of the driver transistor RT2 is also electrically connected to an anode terminal of a light emitting component RO, the source of the driver transistor GT2 is also electrically connected to an anode terminal of a light emitting component GO, and the source of the driver transistor BT2 is also electrically connected to an anode terminal of a light emitting component BO. Specifically, in the present embodiment, the electrode RE serves as the anode of the light emitting component RO, the electrode GE serves as the anode of the light emitting component GO, and the electrode BE serves as the anode of the light emitting component BO. That is, in the present embodiment, the electrode RE is electrically coupled to the data line DL3, the electrode GE is electrically coupled to the data line DL2, and the electrode BE is electrically coupled to the data line DL1. For example, in the present embodiment, the electrode RE is electrically coupled to the data line DL3 via the switch transistor RT1 and the driver transistor RT2. The electrode GE is electrically coupled to the data line DL2 via the switch transistor GT1 and the driver transistor GT2. The electrode BE is electrically coupled to the data line DL1 via the switch transistor BT1 and the driver transistor BT2. Moreover, the material of the electrodes RE, GE and BE includes, for example (but not limited to): silver, aluminum, or other conductive materials having high reflectivity. The material of the electrodes RE, GE and BE may also include, for example (but not limited to): a transparent conductive material such as indium tin oxide (ITO), indium zinc oxide (IZO), aluminum tin oxide (ATO), aluminum zinc oxide (AZO) or the like.

In the present embodiment, the luminescence color of the light emitting layer RL, the luminescence color of the light emitting layer GL and the luminescence color of the light emitting layer BL are different from each other. Specifically, in the present embodiment, the luminescence color of the light emitting layer RL is red, the luminescence color of the light emitting layer GL is green and the luminescence color of the light emitting layer BL is blue. That is, in the present embodiment, the sub-pixel unit R is a red sub-pixel unit, the sub-pixel unit G is a green sub-pixel unit, and the sub-pixel unit B is a blue sub-pixel unit. On the other hand, as mentioned above, if each of the pixel units U further includes a white sub-pixel unit, the light emitting layer of said sub-pixel unit is a white light emitting layer.

In addition, in the present embodiment, the light emitting layer RL has an effective light emitting region RR, the light emitting layer GL has an effective light emitting region GR, and the light emitting layer BL has an effective light emitting region BR. Herein, the term "effective light emitting region" is defined as a region of the light emitting layer that is not covered by a pixel definition layer, or a region that actually emits light when the light emitting layer is lit. In the present embodiment, the sub-pixel units B, G and R respectively have different area ratios between electrode and effective light emitting region. Specifically, when an area of an orthographic projection of the electrode RE on the substrate 100 is defined as $A_E1$, an area of an orthographic projection of the effective light emitting region RR of the light emitting layer RL on the substrate 100 is defined as $A_L1$, and a ratio of the area $A_E1$ to the area $A_L1$ is defined as R1, wherein $R1=A_E1/A_L1$; when an area of an orthographic projection of the electrode GE on the substrate 100 is defined as $A_E2$, an area of an orthographic projection of the effective light emitting region GR of the light emitting layer GL on the substrate 100 is defined as $A_L2$, and a ratio of the area $A_E2$ to the area $A_L2$ is defined as R2, wherein $R2=A_E2/A_L2$; and when an area of an orthographic projection of the electrode BE on the substrate 100 is defined as $A_E3$, an area of an orthographic projection of the effective light emitting region BR of the light emitting layer BL on the substrate 100 is defined as $A_L3$, and a ratio of the area $A_E3$ to the area $A_L3$ is defined as R3, wherein $R3=A_E3/A_L3$. The ratio R1, the ratio R2, and the ratio R3 conform to the following equation: $R1<R2$ or $R3<R2$. It should be noted that, herein, an orthographic projection of a certain component on the substrate 100 refers to a projection of the component on the upper surface X of the substrate 100 in the normal direction D3.

In the present embodiment, the electrode layer 110 is disposed all over the substrate 100 and is located above the light emitting layers RL, GL and BL. Specifically, in the present embodiment, the electrode layer 110 serves as the cathode of the light emitting components RO, GO and BO. That is, in the present embodiment, a portion of the electrode layer 110 that corresponds to the light emitting layer RL, the electrode RE and the light emitting layer RL constitute the light emitting component RO, a portion of the electrode layer 110 that corresponds to the light emitting layer GL, the electrode GE and the light emitting layer GL constitute the light emitting component GO, and a portion of the electrode layer 110 that corresponds to the light emitting layer BL, the electrode BE and the light emitting layer BL constitute the light emitting component BO. In addition, in the present embodiment, the material of the electrode layer 110 includes, for example (but not limited to): a transparent conductive material such as ITO, IZO, ATO, AZO or the like. In the present embodiment, the light emitting components RO, GO and BO are, for example, organic light emitting diodes (OLEDs), inorganic light emitting diodes, or quantum dot light emitting diodes.

As shown in FIG. 2, the cathode terminal of the light emitting component RO is electrically connected to a power supply voltage Vss, the cathode terminal of the light emitting component GO is electrically connected to the power supply voltage Vss, and the cathode terminal of the light emitting component BO is electrically connected to the power supply voltage Vss. It is worth mentioning that the voltage value of the power supply voltage Vdd is higher than the voltage value of the power supply voltage Vss. For example, the power supply voltage Vdd is supplied from a constant voltage source providing a voltage greater than 0 V, and the power supply voltage Vss is supplied from a ground terminal. From another point of view, in the present embodiment, the data line DL3 provides a data signal to the sub-pixel unit R, the data line DL2 provides a data signal to the sub-pixel unit G, and the data line DL1 provides a data signal to the sub-pixel unit B.

It should be particularly mentioned that in the present embodiment, the electrode RE has a region J overlapping the data line DL3 in the normal direction D3, the electrode GE has a region I overlapping the data line DL2 in the normal direction D3, and the electrode BE has a region H overlapping the data line DL1 in the normal direction D3, wherein the area of the region H is greater than the area of the region J, the area of the region H is greater than the area of the region I, and the area of the region J is equal to the area of the region I. That is, in the present embodiment, the electrode RE extends to above the data line DL3, the electrode GE extends to above the data line DL2, and the electrode BE extends to above the data line DL1. In this way, in the present embodiment, a coupling capacitance RCda is generated between the electrode RE and the data line DL3, a coupling capacitance GCda is generated between the electrode GE and the data line DL2, and a coupling capacitance BCda is generated between the electrode BE and the data line DL1.

It is worth mentioning that in the present embodiment, since the area of the region H between the electrode BE and the data line DL1 is greater than the area of the region J between the electrode RE and the data line DL3, and the area of the region H between the electrode BE and the data line DL1 is greater than the area of the region I between the electrode GE and the data line DL2, light intensity variations among the sub-pixel units B, G and R are roughly the same. The reason thereof is explained in detail as follows.

Generally, the red light emitting layer, the green light emitting layer and the blue light emitting layer have different light emitting efficiencies. Thus, under driving by the same current, in order to enable the sub-pixel units emitting lights of different colors to have the same luminous intensity, the effective light emitting regions of the red light emitting layer, the green light emitting layer and the blue light emitting layer are designed to have different areas. Specifically, in the present embodiment, the area of the effective light emitting region BR is greater than the area of the effective light emitting region RR, and the area of the effective light emitting region RR is greater than the area of the effective light emitting region GR.

On the other hand, as mentioned above, although in the sub-pixel unit R, the voltage difference variation amount $\Delta V_{GSR}$ occurs in the voltage difference $V_{GS}$ between the nodes Ra and Rb due to the coupling effect caused by the parasitic capacitance Cx, by means of the coupling capacitance RCda generated by overlapping the electrode RE and the data line DL3, the voltage difference variation amount $\Delta V_{GSR}$ can be reduced. Similarly, by overlapping the electrode GE and the data line DL2 to generate the coupling capacitance GCda, the voltage difference variation amount $\Delta V_{GSG}$ between the nodes Ga and Gb can be reduced; and by overlapping the electrode BE and the data line DL1 to generate the coupling capacitance BCda, the voltage difference variation amount $\Delta V_{GSB}$ between the nodes Ba and Bb can be reduced.

Furthermore, it is found through simulation experiments that, as the value of the coupling capacitance between the electrode and the data line increases (i.e., the area of the region between the electrode and the data line increases), the voltage difference variation amount $\Delta V_{GS}$ decreases. Specifically, the simulation experiments were performed using a sub-pixel unit in which a sub-pixel driving unit has a 4T2C structure. Results of the simulation experiments are shown in the following Table 1.

TABLE 1

| Value of Coupling Capacitance (fF) | Voltage Difference Variation Amount $\Delta V_{GS}$ (mV) |
|---|---|
| 1 | 114.39 |
| 5 | 96.83 |
| 10 | 80.68 |
| 20 | 59.68 |
| 40 | 37.90 |
| 100 | 15.49 |

Based on the above, the greater the value of the coupling capacitance between the electrode and the data line (i.e., the greater the area of the region between the electrode and the data line), the smaller the voltage difference variation amount $\Delta V_{GS}$. In order to cause the light intensity variations of the sub-pixel units B, G and R as a result of data line coupling to be roughly the same, how to design the overlap area between the electrodes in each of the sub-pixel units and the data lines is inferred and explained as follows.

Light intensity is a product obtained by multiplying light brightness by light emission area, and light brightness is a function of power. Therefore, light intensity may be expressed as Formula 1-2 in a simplified manner:

$$I_v = L_v \times A \qquad \text{Formula 1,}$$

$$L_v = K \times Y \qquad \text{Formula 1-1,}$$

$$I_v = K \times Y \times A \qquad \text{Formula 1-2,}$$

wherein $I_v$ represents light intensity, $L_v$ represents light brightness, A represents an area of an effective light emitting region of a light emitting layer, Y represents power, K represents a coefficient of a relationship between light brightness and power and this coefficient is in units of nits/mW.

In addition, the voltage difference variation amount $\Delta V_{GS}$ between the nodes Ra and Rb results in a variation in power, and a relationship therebetween may be expressed as Formula 2:

$$\Delta Y = I \times \Delta V_{GS} \qquad \text{Formula 2,}$$

wherein $\Delta Y$ represents a power variation amount, and I represents current.

In order to cause the light intensity variations of the sub-pixel units B, G and R as a result of data line coupling to be roughly the same, the following equations may be obtained:

$$\Delta I_v = K_R \times \Delta Y_R \times A_R = K_G \times \Delta Y_G \times A_G = K_B \times \Delta Y_B \times A_B \qquad \text{Formula 3,}$$

wherein $\Delta I_v$ represents a light intensity variation amount, $K_R$ represents a coefficient of a relationship between light brightness and power of a red light emitting layer, $K_G$ represents a coefficient of the relationship between light brightness and power of a green light emitting layer, $K_B$ represents a coefficient of the relationship between light brightness and power of a blue light emitting layer, $A_R$ represents the area of the effective light emitting region of the red light emitting layer, $A_G$ represents the area of the effective light emitting region of the green light emitting layer, and $A_B$ represents the area of the effective light emitting region of the blue light emitting layer.

Next, according to Formula 1-1, the relationships between light brightness and power of each of the light emitting layers are measured through experiments, so as to obtain $K_R$, $K_G$ and $K_B$. The steps thereof include providing a plurality of sets of powers respectively to each of the light emitting layers and then recording the brightness of light generated by each of the light emitting layers. The measurement results are analyzed, thus obtaining that the relationships between light brightness and power of the red light emitting layer, the green light emitting layer and the blue light emitting layer can be expressed as the following Formula 4 to Formula 6, respectively, wherein the constants in Formula 4 to Formula 6 refer to the minimum powers required for each of the light emitting layers to emit light:

$$Y=2.66L_v+413.83 \quad \text{Formula 4,}$$

$$Y=1.87L_v+423.14 \quad \text{Formula 5,}$$

$$Y=3.91L_v+392.28 \quad \text{Formula 6,}$$

wherein $L_v$ represents light brightness and is in units of nits, and Y represents power and is in units of mW.

It is known from the above Formulae 4 to 6 that $K_R$, $K_G$ and $K_B$ are respectively reciprocals of 2.66, 1.87 and 3.91, and these three coefficients are in units of nits/mW. Next, Formula 2 and the values of $K_R$, $K_G$ and $K_B$ are substituted into Formula 3, and it is assumed that the currents flowing to each of the light emitting layers are equal. Accordingly, the following equations may be obtained:

$$K_R \times \Delta V_{GSR} \times A_R = K_G \times \Delta V_{GSG} \times A_G = K_B \times \Delta V_{GSB} \times A_B \quad \text{Formula 7,}$$

$$(1/2.66) \times \Delta V_{GSR} \times A_R = (1/1.87) \times \Delta V_{GSG} \times A_G = (1/3.91) \times \Delta V_{GSB} \times A_B \quad \text{Formula 8,}$$

wherein $\Delta V_{GSR}$ represents the voltage difference variation amount of the sub-pixel unit R between the nodes Ra and Rb, $\Delta V_{GSG}$ represents the voltage difference variation amount of the sub-pixel unit G between the nodes Ga and Gb, and $\Delta V_{GSB}$ represents the voltage difference variation amount of the sub-pixel unit B between the nodes Ba and Bb.

Next, assuming that:

$$A_R:A_G:A_B=1.40:1.00:2.80 \quad \text{Formula 9,}$$

when Formula 9 is substituted into Formula 8, the following equation may be obtained:

$$\Delta V_{GSR}:\Delta V_{GSG}:\Delta V_{GSB}=1.00:0.98:0.73 \quad \text{Formula 10.}$$

It is known from the above inferences that, under driving by the same current and under the conditions that the area $A_B$ of the effective light emitting region BR is greater than the area $A_R$ of the effective light emitting region RR and the area $A_R$ of the effective light emitting region RR is greater than the area $A_G$ of the effective light emitting region GR, in order to cause luminous intensity variations of the sub-pixel units R, G and B to become consistent, the voltage difference variation amount $\Delta V_{GSB}$ of the sub-pixel unit B may be designed to be smaller than the voltage difference variation amount $\Delta V_{GSG}$ of the sub-pixel unit G, and the voltage difference variation amount $\Delta V_{GSG}$ of the sub-pixel unit G may be designed to be smaller than the voltage difference variation amount $\Delta V_{GSR}$ of the sub-pixel unit R.

The greater the value of the coupling capacitance between the electrode and the data line (i.e., the greater the area of the region between the electrode and the data line), the smaller the voltage difference variation amount $\Delta V_{GS}$. Therefore, the coupling capacitance between the electrode of the sub-pixel unit B and the data line is designed to be greater than the coupling capacitance between the electrode of the sub-pixel unit G and the data line, and the coupling capacitance between the electrode of the sub-pixel unit G and the data line is designed to be greater than the coupling capacitance between the electrode of the sub-pixel unit R and the data line. In this way, the area of the region between the electrode of the sub-pixel unit B and the data line is greater than the area of the region between the electrode of the sub-pixel unit G and the data line, and the area of the region between the electrode of the sub-pixel unit G and the data line is greater than the area of the region between the electrode of the sub-pixel unit R and the data line.

In addition, in the present embodiment, although the area of the region J between the electrode RE and the data line DL3 is equal to the area of the region I between the electrode GE and the data line DL2, the relationship between the area of the region J and the area of the region I is not particularly limited in the disclosure. In other words, in other embodiments, the area of the region J may be smaller than or greater than the area of the region I.

In addition, although in the above embodiment, an example is given where the sub-pixel units B, G and R have the structures shown in FIG. 1, the disclosure is not limited thereto. In other words, in other embodiments, the sub-pixel units B, G and R may have other structures. The other embodiments are explained below with reference to FIG. 3. It should be noted that, the reference numerals and part of content of the aforementioned embodiment continue to be used in the following embodiments, wherein the same or similar reference numerals denote the same or similar components, and the same technical content is omitted. Explanation for the omitted part may be found in the aforementioned embodiment, and will not be repeated in the following embodiments.

Figure 3:
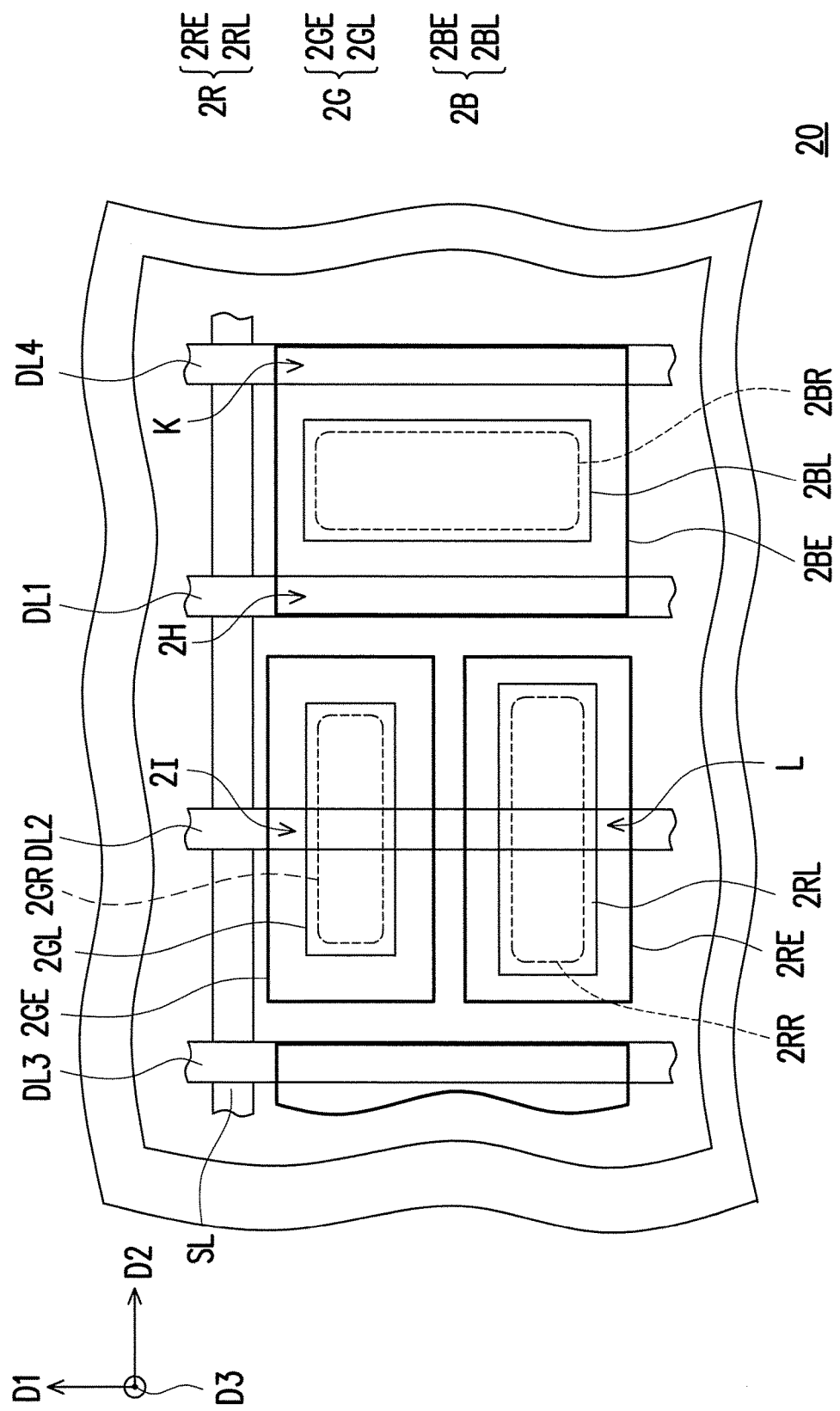
FIG. 3 is a partial schematic top view of a display device according to a second embodiment of the disclosure.

FIG. 3 is a partial schematic top view of a display device according to a second embodiment of the disclosure. Referring to FIG. 3 and FIG. 1, a display device 20 of the present embodiment is similar to the display device 10 of FIG. 1, and the difference mainly lies in the arrangement manner of electrodes in sub-pixel units. Therefore, the difference between the two display devices 10, 20 is explained below. Moreover, for the ease of description, some members such as the substrate 100, the sub-pixel driving units Ru, Gu and Bu, and the electrode 110 are omitted from FIG. 3.

Referring to FIG. 3, in the present embodiment, an electrode 2BE in a sub-pixel unit 2B has not only an region 2H overlapping the data line DL1 in the normal direction D3, but also an region K overlapping the data line DL4 in the normal direction D3, wherein the data line DL4 is adjacent to the data line DL1. That is, in the present embodiment, the electrode 2BE in the sub-pixel unit 2B not only extends to above the data line DL1 that provides a data signal to the sub-pixel unit 2B, but also extends to above the other data lines.

In addition, in the present embodiment, an electrode 2GE in a sub-pixel unit 2G has a region 2I overlapping the data line DL2 in the normal direction D3. That is, in the present embodiment, the electrode 2GE in the sub-pixel unit 2G extends to above the data line DL2 that provides a data signal to the sub-pixel unit 2G. Furthermore, in the present embodiment, the area of the region 2H is greater than the area of the region 2I.

In addition, in the present embodiment, an electrode 2RE in a sub-pixel unit 2R does not overlap the data line DL3 that provides a data signal to the sub-pixel unit 2R. That is, in the present embodiment, an area of a region of the electrode 2RE in the sub-pixel unit 2R overlapping the data line DL3 in the normal direction D3 is zero. On the other hand, in the present embodiment, the electrode 2RE in the sub-pixel unit 2R has a region L overlapping the data line DL2 in the normal direction D3. That is, in the present embodiment, the electrode 2RE in the sub-pixel unit 2R extends to above the data line DL2 that provides the data signal to the sub-pixel unit 2G, but does not overlap the data line DL3 that provides the data signal to the sub-pixel unit 2R.

It is worth mentioning that, as mentioned above, in the present embodiment, under driving by the same current and under conditions that an area of an effective light emitting region 2BR of a light emitting layer 2BL is greater than an area of an effective light emitting region 2RR of a light emitting layer 2RL and the area of the effective light emitting region 2RR of the light emitting layer 2RL is greater than an area of an effective light emitting region 2GR of a light emitting layer 2GL, since the area of the region 2H between the electrode 2BE and the data line DL1 is greater than the area of the region 2I between the electrode 2GE and the data line DL2, and the area of the region 2H between the electrode 2BE and the data line DL1 is greater than the area (which is zero) of the region between the electrode 2RE and the data line DL3, luminous intensity variations of the sub-pixel units 2R, 2G and 2B become consistent.

In addition, in the present embodiment, since the electrode 2BE in the sub-pixel unit 2B also overlaps the data line DL4, and the electrode 2RE in the sub-pixel unit 2R overlaps the data line DL2, the color temperature of the display device 20 can be adjusted.

In addition, although in the above embodiments of FIG. 1 and FIG. 3, the pixel unit U is exemplified by including three sub-pixel units (i.e., the sub-pixel units R, G, B, or the sub-pixel units 2R, 2G and 2B), the disclosure does not limit the number of the sub-pixel units in one pixel unit. The other embodiments are explained below with reference to FIG. 4 and FIG. 5. It should be noted that, the reference numerals and part of content of the aforementioned embodiments continue to be used in the following embodiments, wherein the same or similar reference numerals denote the same or similar components, and the same technical content is omitted. Explanation for the omitted part may be found in the aforementioned embodiments, and will not be repeated in the following embodiments.

Figure 4:
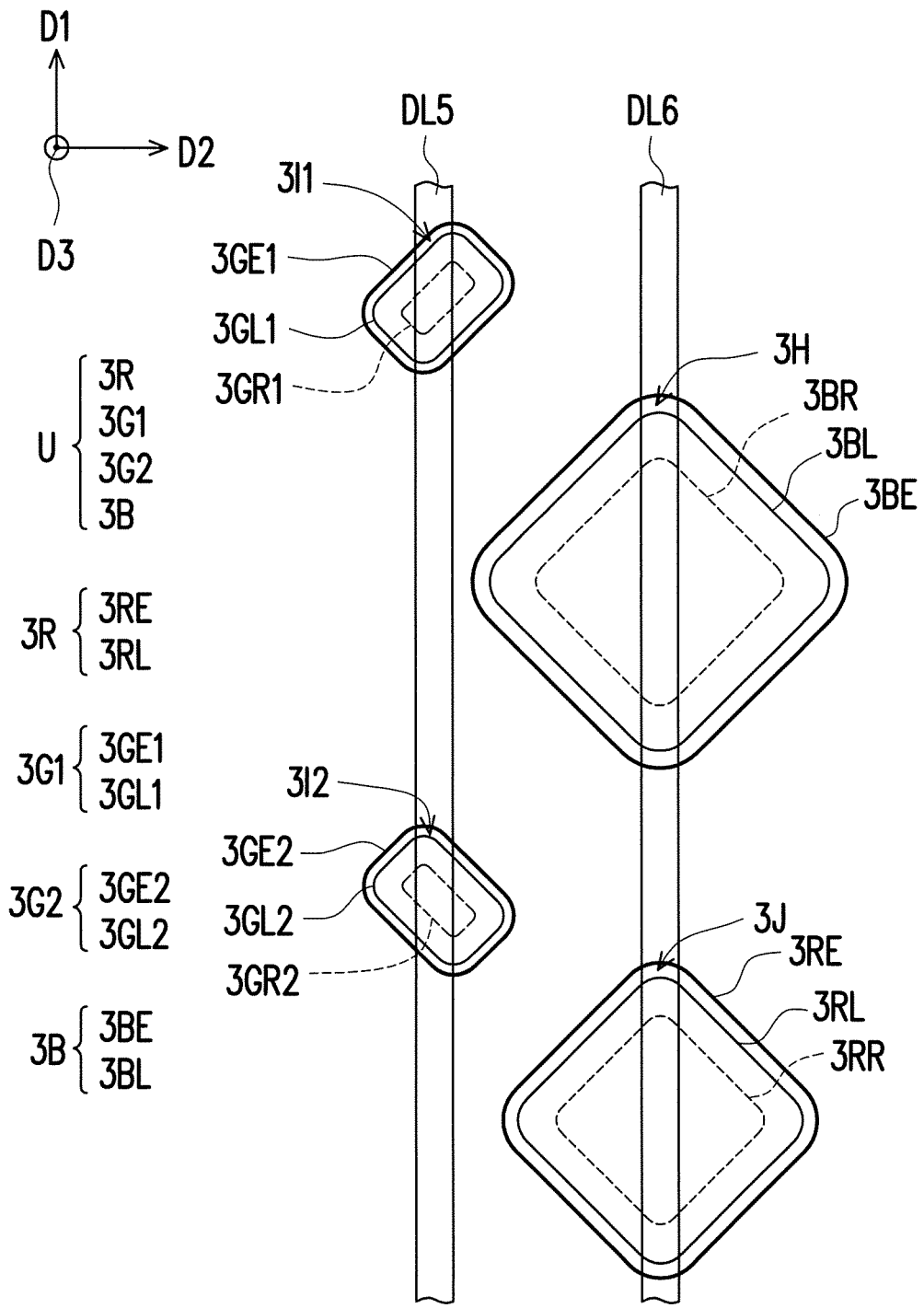
FIG. 4 is a partial schematic top view of a display device according to a third embodiment of the disclosure.

FIG. 4 is a partial schematic top view of a display device according to a third embodiment of the disclosure. Referring to FIG. 4 and FIG. 3, a display device 30 of the present embodiment is similar to the display device 20 of FIG. 3, and the difference mainly lies in the arrangement manner of electrodes in sub-pixel units. Therefore, the difference between the two display devices 20, 30 is explained below. Moreover, for the ease of description, some members are omitted from FIG. 4.

Referring to FIG. 4, in the present embodiment, the pixel unit U includes a sub-pixel unit 3B, a sub-pixel unit 3G1, a sub-pixel unit 3G2 and a sub-pixel unit 3R. That is, in the present embodiment, the pixel unit U includes four sub-pixel units.

Specifically, in the present embodiment, a luminescence color of a light emitting layer 3GL1 in the sub-pixel unit 3G1 and a luminescence color of a light emitting layer 3GL2 in the sub-pixel unit 3G2 are the same, and the luminescence color of the light emitting layer 3GL1 in the sub-pixel unit 3G1 is different from luminescence colors of a light emitting layer 3BL in the sub-pixel unit 3B and a light emitting layer 3RL in the sub-pixel unit 3R. That is, in the present embodiment, the four sub-pixel units in the pixel unit U may emit lights of three different colors. Specifically, in the present embodiment, the light emitting layer 3RL is a red light emitting layer, the light emitting layers 3GL1 and 3GL2 are both green light emitting layers, and the light emitting layer 3BL is a blue light emitting layer. That is, in the present embodiment, the sub-pixel unit 3R is a red sub-pixel unit, the sub-pixel units 3G1 and 3G2 are both green sub-pixel units, and the sub-pixel unit 3B is a blue sub-pixel unit.

In addition, in the present embodiment, a data line DL5 provides a data signal to the sub-pixel units 3G1 and 3G2, and a data line DL6 provides a data signal to the sub-pixel units 3B and 3R. That is, in the present embodiment, the sub-pixel units 3G1 and 3G2 share the same data line DL5, and the sub-pixel units 3B and 3R share the same data line DL6.

In addition, in the present embodiment, an electrode 3BE has a region 3H overlapping the data line DL6 in the normal direction D3, an electrode 3RE has a region 3J overlapping the data line DL6 in the normal direction D3, an electrode 3GE1 has a region 3I1 overlapping the data line DL5 in the normal direction D3, and an electrode 3GE2 has a region 3I2 overlapping the data line DL5 in the normal direction D3.

Specifically, in the present embodiment, the area of the region 3H is greater than the area of the region 3J, the area of the region 3H is greater than the area of the region 3I1, and the area of the region 3H is greater than the area of the region 3I2. As mentioned above, in the present embodiment, under driving by the same current and under conditions that an area of an effective light emitting region 3BR of the light emitting layer 3BL is greater than an area of an effective light emitting region 3RR of the light emitting layer 3RL and the area of the effective light emitting region 3RR of the light emitting layer 3RL is greater than an area of an effective light emitting region 3GR1 of the light emitting layer 3GL1 and an area of an effective light emitting region 3GR2 of the light emitting layer 3GL2, since the area of the region 3H between the electrode 3BE and the data line DL6 is greater than the area of the region 3J between the electrode 3RE and the data line DL6, the area of the region 3H between the electrode 3BE and the data line DL6 is greater than the area of the region 3I1 between the electrode 3GE1 and the data line DL5, and the area of the region 3H between the electrode 3BE and the data line DL6 is greater than the area of the region 3I2 between the electrode 3GE2 and the data line DL5, luminous intensity variations of the sub-pixel units 3B, 3G1, 3G2 and 3R become consistent.

In the present embodiment, the sub-pixel units 3B, 3G1 and 3R respectively have different area ratios between electrode and effective light emitting region. Specifically, when an area of an orthographic projection of the electrode 3RE on the substrate 100 is defined as $A_E1$, an area of an orthographic projection of the effective light emitting region 3RR of the light emitting layer 3RL on the substrate 100 is defined as $A_L1$, and a ratio of the area $A_E1$ to the area $A_L1$ is defined as R1, wherein $R1=A_E1/A_L1$; when an area of an orthographic projection of the electrode 3GE1 on the substrate 100 is defined as $A_E2$, an area of an orthographic projection of the effective light emitting region 3GR1 of the light emitting layer 3GL1 on the substrate 100 is defined as $A_L2$, and a ratio of the area $A_E2$ to the area $A_L2$ is defined as R2, wherein $R2=A_E2/A_L2$; and when an area of an orthographic projection of the electrode 3BE on the substrate 100 is defined as $A_E3$, an area of an orthographic projection of the effective light emitting region 3BR of the light emitting layer 3BL on the substrate 100 is defined as $A_L3$, and a ratio of the area $A_E3$ to the area $A_L3$ is defined as R3, wherein $R3=A_E3/A_L3$. The ratio R1, the ratio R2, and the ratio R3 conform to the following equation: R1<R2 or R3<R2. It should be noted that, herein, the orthographic projection of a certain component on the substrate 100 refers to the projection of the component on the upper surface X of the substrate 100 in the normal direction D3.

In addition, although in the above embodiment of FIG. 4, an example is given where the sub-pixel units 3B, 3G1, 3G2 and 3R have the structures shown in FIG. 4, the disclosure is not limited thereto. In other words, in other embodiments, the sub-pixel units 3B, 3G1, 3G2 and 3R may have other structures. The other embodiments are explained below with reference to FIG. 5. It should be noted that, the reference numerals and part of content of the aforementioned embodiments continue to be used in the following embodiments, wherein the same or similar reference numerals denote the same or similar components, and the same technical content is omitted. Explanation for the omitted part may be found in the aforementioned embodiments, and will not be repeated in the following embodiments.

Figure 5:
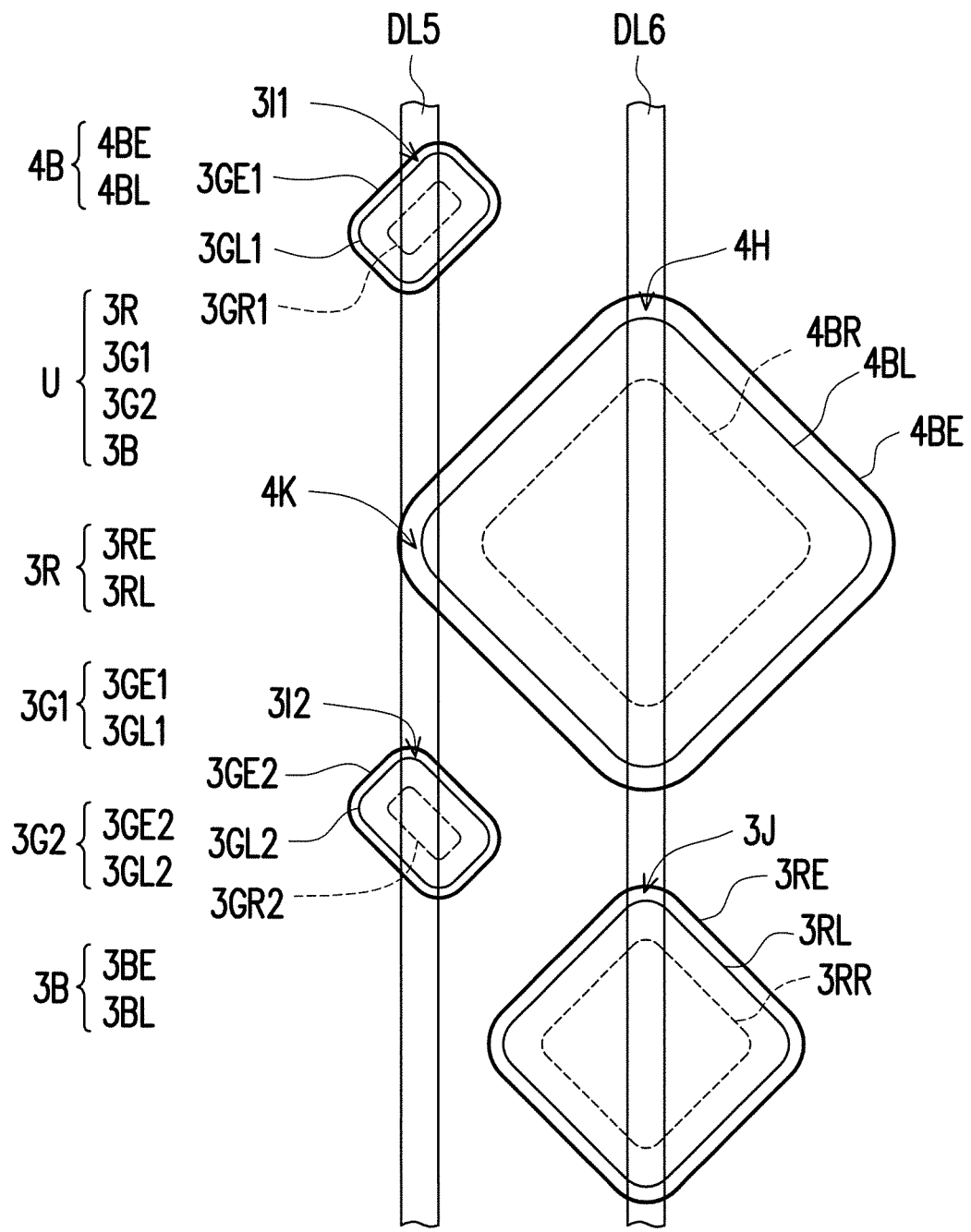
FIG. 5 is a partial schematic top view of a display device according to a fourth embodiment of the disclosure.

FIG. 5 is a partial schematic top view of a display device according to a fourth embodiment of the disclosure. Referring to FIG. 5 and FIG. 4, a display device 40 of the present embodiment is similar to the display device 30 of FIG. 4, and the difference mainly lies in the arrangement manner of electrodes in sub-pixel units. Therefore, the difference between the two display devices 30, 40 is explained below. Moreover, for the ease of description, some members are omitted from FIG. 5.

Referring to FIG. 5, in the present embodiment, an electrode 4BE in a sub-pixel unit 4B has not only an region 4H overlapping the data line DL6 in the normal direction D3, but also an region 4K overlapping the data line DL5 in the normal direction D3. That is, in the present embodiment, the electrode 4BE in the sub-pixel unit 4B not only extends to above the data line DL6 that provides a data signal to the sub-pixel unit 4B, but also extends to above the other data lines.

In addition, in the present embodiment, the area of the region 4H is greater than the area of the region 3J, the area of the region 4H is greater than the area of the region 3I1, and the area of the region 4H is greater than the area of the region 3I2. In this way, as mentioned above, in the present embodiment, under driving by the same current and under conditions that an area of an effective light emitting region 4BR of a light emitting layer 4BL is greater than the area of the effective light emitting region 3RR of the light emitting layer 3RL and the area of the effective light emitting region 3RR of the light emitting layer 3RL is greater than the area of the effective light emitting region 3GR1 of the light emitting layer 3GL1 and the area of the effective light emitting region 3GR2 of the light emitting layer 3GL2, since the area of the region 4H between the electrode 4BE and the data line DL6 is greater than the area of the region 3J between the electrode 3RE and the data line DL6, the area of the region 4H between the electrode 4BE and the data line DL6 is greater than the area of the region 3I1 between the electrode 3GE1 and the data line DL5, and the area of the region 4H between the electrode 4BE and the data line DL6 is greater than the area of the region 3I2 between the electrode 3GE2 and the data line DL5, luminous intensity variations of the sub-pixel units 4B, 3G1, 3G2 and 3R become consistent.

In addition, in the present embodiment, since the electrode 4BE in the sub-pixel unit 4B also overlaps the data line DL5, the color temperature of the display device 40 can be adjusted.

In summary, in the display device of the disclosure, since in the normal direction of the upper surface of the substrate, the area of the region between the sub-pixel unit including the blue light emitting layer (i.e., the sub-pixel units B, 2B, 3B and 4B) and its corresponding data line (i.e., the data lines DL1 and DL6) is greater than the area of the region between the sub-pixel unit including a light emitting layer which a luminescence color thereof is different from that of the blue light emitting layer (i.e., the sub-pixel units G, 2G, 3G1, 3G2, R, 2R and 3R) and its corresponding data line (i.e., the data lines DL3, DL2 and DL5), luminous intensity variations of the aforementioned sub-pixel units become consistent, thus improving display quality of the display device.

Although the disclosure has been disclosed in terms of embodiments as above, the various technical means described in the first to fourth embodiments or any other embodiments not specifically described herein can all be used in a mixed or combined form as long as there is no conflict therebetween. In addition, the various embodiments of the disclosure can be used in combination with various touch devices, and may be applied to various electronic devices such as mobile phones, tablets, notebook computers, TVs and so on.

Although the disclosure has been disclosed in terms of embodiments as above, these embodiments are not intended to limit the disclosure. Any person skilled in the art may make some alterations and modifications without departing from the spirit and scope of the disclosure. Thus, the protection scope for the disclosure should be defined by the claims.

What is claimed is:

1. A display device comprising:
    a substrate, an upper surface of the substrate having a normal direction;
    a first data line and a second data line, disposed on the substrate;
    a first sub-pixel unit disposed on the substrate, the first sub-pixel unit comprising:
        a first electrode electrically coupled to the first data line, the first electrode having a first region overlapping the first data line in the normal direction, the first region having a first area; and
        a first light emitting layer disposed on the first electrode, and
    a second sub-pixel unit disposed on the substrate, the second sub-pixel unit comprising:
        a second electrode electrically coupled to the second data line, the second electrode having a second region overlapping the second data line in the normal direction, the second region having a second area, wherein the first area is greater than the second area; and
        a second light emitting layer disposed on the second electrode,
    wherein a luminescence color of the first light emitting layer is different from a luminescence color of the second light emitting layer and the luminescence color of the first light emitting layer is blue.

2. The display device according to claim 1, wherein the luminescence color of the second light emitting layer is green or red.

3. The display device according to claim 1, further comprising a third data line and a third sub-pixel unit disposed on the substrate, wherein the third sub-pixel unit comprises:
    a third electrode electrically coupled to the third data line, the third electrode having a third region overlapping the third data line in the normal direction, the third region having a third area, wherein the first area is greater than the third area; and a third light emitting layer disposed on the third electrode, wherein a luminescence color of the third light emitting layer is different from the luminescence color of the first light emitting layer, and the luminescence color of the third light emitting layer is different from the luminescence color of the second light emitting layer.

4. The display device according to claim 3, wherein the luminescence color of the second light emitting layer is green, and the luminescence color of the third light emitting layer is red.

5. The display device according to claim 3, wherein the third area is equal to the second area.

6. The display device according to claim 3, wherein the second area is greater than the third area.

7. The display device according to claim 3, further comprising a fourth data line disposed on the substrate, the fourth data line being adjacent to the first data line, the first electrode further comprising a fourth region overlapping the fourth data line in the normal direction.

8. The display device according to claim 7, wherein the third electrode has a fifth region overlapping the second data line in the normal direction.

9. The display device according to claim 3, wherein an area of a projection of the first electrode on the upper surface of the substrate in the normal direction is defined as $A_E1$, an area of a projection of an effective light emitting region of the first light emitting layer on the upper surface of the substrate in the normal direction is defined as $A_L1$, and a ratio of the area $A_E1$ to the area $A_L1$ is defined as R1;

an area of a projection of the second electrode on the upper surface of the substrate in the normal direction is defined as $A_E2$, an area of a projection of an effective light emitting region of the second light emitting layer on the upper surface of the substrate in the normal direction is defined as $A_L2$, and a ratio of the area $A_E2$ to the area $A_L2$ is defined as R2; and an area of a projection of the third electrode on the upper surface of the substrate in the normal direction is defined as $A_E3$, an area of a projection of an effective light emitting region of the third light emitting layer on the upper surface of the substrate in the normal direction is defined as $A_L3$, and a ratio of the area $A_E3$ to the area $A_L3$ is defined as R3;

wherein the ratio R1, the ratio R2, and the ratio R3 conform to the following equation:

R1<R2 or R3<R2.

10. The display device according to claim 1, further comprising a third sub-pixel unit disposed on the substrate, wherein the third sub-pixel unit comprises:

a third electrode having a sixth region overlapping the first data line in the normal direction, the sixth region having a fourth area, wherein the first area is greater than the fourth area; and a third light emitting layer disposed on the third electrode, wherein a luminescence color of the third light emitting layer is different from the luminescence color of the first light emitting layer, and the luminescence color of the third light emitting layer is different from the luminescence color of the second light emitting layer.

11. The display device according to claim 10, wherein the luminescence color of the second light emitting layer is green, and the luminescence color of the third light emitting layer is red.

12. The display device according to claim 11, wherein the fourth area is greater than the second area.

13. The display device according to claim 12, wherein the first electrode has a seventh region overlapping the second data line in the normal direction.

14. The display device according to claim 10, wherein an area of a projection of the first electrode on the upper surface of the substrate in the normal direction is defined as $A_E1$, an area of a projection of an effective light emitting region of the first light emitting layer on the upper surface of the substrate in the normal direction is defined as $A_L1$, and a ratio of the area $A_E1$ to the area $A_L1$ is defined as R1;

an area of a projection of the second electrode on the upper surface of the substrate in the normal direction is defined as $A_E2$, an area of a projection of an effective light emitting region of the second light emitting layer on the upper surface of the substrate in the normal direction is defined as $A_L2$, and a ratio of the area $A_E2$ to the area $A_L2$ is defined as R2; and an area of a projection of the third electrode on the upper surface of the substrate in the normal direction is defined as $A_E3$, an area of a projection of an effective light emitting region of the third light emitting layer on the upper surface of the substrate in the normal direction is defined as $A_L3$, and a ratio of the area $A_E3$ to the area $A_L3$ is defined as R3;

wherein the ratio R1, the ratio R2, and the ratio R3 conform to the following equation:

R1<R2 or R3<R2.

* * * * *